US012795840B2

(12) United States Patent
Agrawal et al.

(10) Patent No.: US 12,795,840 B2
(45) Date of Patent: Nov. 10, 2026

(54) DYNAMICALLY SWITCHING EXTERIOR MATERIAL TEXTURE OF PORTABLE DEVICE BASED ON A SENSED SUPPORT CONDITION

(71) Applicant: MOTOROLA MOBILITY LLC, Wilmington, DE (US)

(72) Inventors: Amit Kumar Agrawal, Bangalore (IN); Eunji Kim, Chicago, IL (US); Mayank Gupta, Naperville, IL (US)

(73) Assignee: Motorola Mobility LLC, Chicago, IL (US)

( * ) Notice: Subject to any disclaimer, the term of this patent is extended or adjusted under 35 U.S.C. 154(b) by 358 days.

(21) Appl. No.: 18/494,432

(22) Filed: Oct. 25, 2023

(65) Prior Publication Data

US 2025/0142743 A1 May 1, 2025

(51) Int. Cl.
*H05K 5/02* (2006.01)
*H05K 5/00* (2006.01)

(52) U.S. Cl.
CPC ......... *H05K 5/0217* (2013.01); *H05K 5/0018* (2022.08)

(58) Field of Classification Search
CPC ........................... H05K 5/0217; H05K 5/0018
See application file for complete search history.

(56) References Cited

U.S. PATENT DOCUMENTS 8,933,877 B2 1/2015 Alameh
9,116,567 B2 8/2015 Alberth, Jr.
9,423,995 B2 8/2016 Arneson
9,612,622 B2 * 4/2017 Moon ...................... H02H 6/00
9,740,839 B2 8/2017 Zafiris
11,196,852 B2 * 12/2021 Li ......................... H04M 1/185
11,968,319 B2 4/2024 Desai
12,056,414 B2 8/2024 Desai
2011/0194230 A1 * 8/2011 Hart ...................... H04M 1/185
361/437

(Continued)

FOREIGN PATENT DOCUMENTS

WO 2018032707 A1 2/2018

OTHER PUBLICATIONS

English Translation of WIPO Publication 2018032707 (Year: 2018).*

*Primary Examiner* — Patrick N Edouard
*Assistant Examiner* — Eboni N Giles
(74) *Attorney, Agent, or Firm* — Isidore PLLC

(57) ABSTRACT

An electronic device includes at least one external surface comprised of a material whose texture can be dynamically changed by a device-generated trigger. The device includes: at least one sensor that detects a support condition of the device; and a controller communicatively coupled to the sensor and to a component that provides the device-generated trigger. The controller: receives, from the sensor, sensor input corresponding to the support condition; and evaluates the received sensor input to determine whether a current support condition is one that triggers the controller to cause a change in the texture of the external surface material. In response to the current support condition being one that triggers the change in the texture of the external surface material, the controller transmits a signal to the component, which activates the component to provide the device-generated trigger, causing the change in the texture of the external surface material.

20 Claims, 11 Drawing Sheets

(56) References Cited

U.S. PATENT DOCUMENTS

| | | | | |
|---|---|---|---|---|
| 2014/0320536 | A1* | 10/2014 | Mok | G06T 3/60<br>345/659 |
| 2021/0392255 | A1 | 12/2021 | Zhu | |
| 2025/0141992 | A1* | 5/2025 | Agrawal | H04M 1/72454 |

* cited by examiner

DYNAMICALLY SWITCHING EXTERIOR MATERIAL TEXTURE OF PORTABLE DEVICE BASED ON A SENSED SUPPORT CONDITION

BACKGROUND

1. Technical Field

The present disclosure relates generally to portable electronic devices, and more particularly to the exterior casing of portable electronic devices.

2. Description of the Related Art

Portable electronic devices, such as smartphones, have become ubiquitous. These portable electronic devices include sensitive interior circuitry that are partially enclosed by an exterior protective casing or housing. The exterior casing includes one or more open spaces for integration of a device display, and smaller openings for integration of additional exterior components, such as input/output (I/O) buttons, power buttons, etc. Many modern devices are configured with a full display encompassing the entire front side of the electronic device, with a casing made of durable material (e.g., metal) primarily occupying the back and sides of the electronic device. With customers preferring to have sleeker and more aesthetically appealing, but lightweight portable electronic devices, the exterior casing of these devices are often designed using a lightweight material that provides the desired appeal/look. The sleek looking, lightweight exterior casing comes with the tradeoff of the device having a more slippery feel and being more susceptible to damage when the device falls from a height.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
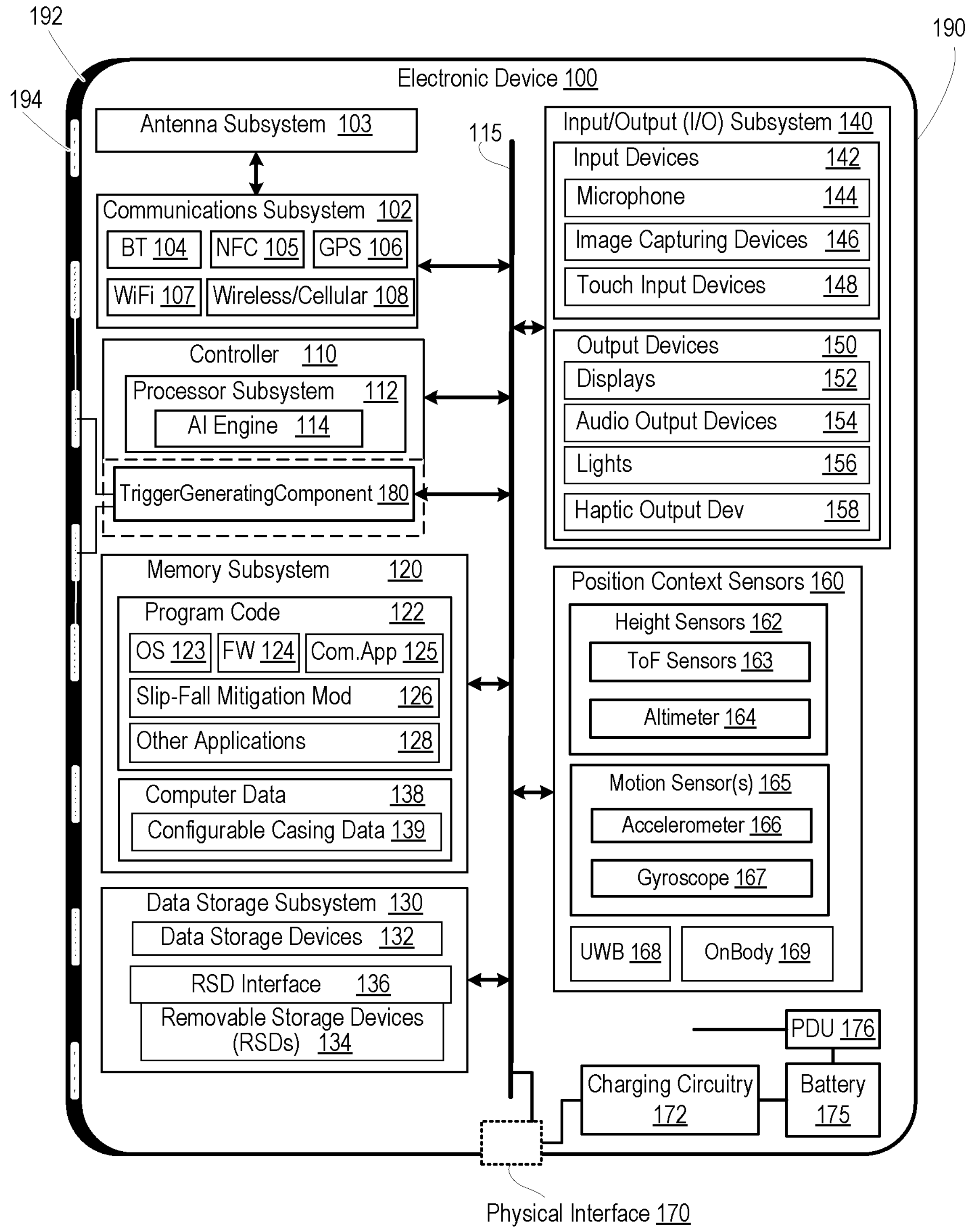
FIG. 1 presents a block component diagram of an electronic device configured with a modifiable exterior rear panel and integrated electronics that dynamically modifies a texture of the exterior panel to prevent device slippage and provide protection of the device from falling, according to one or more embodiments.

The present disclosure provides an electronic device, a method, and an electronic device casing for dynamically modifying the material of an exterior rear panel or attached casing to prevent and/or protect the electronic device from slipping or falling, in response to a device-sensed support condition. According to a first aspect of the present disclosure, the electronic device includes at least one external surface comprised of a material whose texture can be dynamically changed based on exposure to a device-generated trigger, which is generated in response to a sensed support condition. The electronic device includes at least one sensor that detects a support condition of the electronic device. The electronic device includes a controller communicatively coupled to the at least one sensor and to a component that provides the device-generated trigger. The controller: receives, from the at least one sensor, sensor input corresponding to the support condition; and evaluates the received sensor input to determine whether a current support condition is one which triggers the controller to cause a change in the texture of the external material. In one or more embodiments, the particular support condition is one that, when detected, triggers the controller to respond by causing the change in the texture of the external surface material in order to enhance protection of the device from falling or from being damaged as a result of a fall. In response to determining that the current support condition is one that triggers the change in the texture of the external surface material to enhance protection of the device, the controller transmits a signal to the component, which signal activates the component to provide the device-generated trigger, causing the change in the texture of the external surface material. By integrating this feature into the electronic device, the electronic devices are protected from slipping or falling and are also protected from being damaged due to slipping/falling from a user's hand or an elevated surface. In one or more embodiments, the component is a texture change component incorporated within the controller, and the device-generated trigger is thus transmitted by the controller, via the texture change component, to elements that cause the change in the texture of the external surface material.

One additional aspect of the disclosure provides an electronic device cover that includes an exterior material having a configurable texture that can be changed based on a received device-provided trigger generated in response to a detected support condition of an electronic device on which the electronic device cover is placed. In one embodiment, the received device-provided trigger is a change in at least one of a voltage, a pressure, a current, a temperature, or a humidity applied to the exterior material by the electronic device in response to the detected support condition. In an alternate embodiment, the electronic device cover includes electronics for: communicatively coupling the cover to the controller of the electronic device to which the cover is attached; receiving the device-provided signal from the controller of the electronic device, via a transmitter; and triggering the change in the material texture on receipt of the device-provided signal. The controller of the electronic device is communicatively connected to a transmitter that is paired to the electronics embedded in the electronic device cover.

In the following detailed description of exemplary embodiments of the disclosure, specific exemplary embodiments in which the various aspects of the disclosure may be practiced are described in sufficient detail to enable those skilled in the art to practice the invention, and it is to be understood that other embodiments may be utilized and that logical, architectural, programmatic, mechanical, electrical, and other changes may be made without departing from the spirit or scope of the present disclosure. The following detailed description is, therefore, not to be taken in a limiting sense, and the scope of the present disclosure is defined by the appended claims and equivalents thereof. Within the descriptions of the different views of the figures, similar elements are provided similar names and reference numerals as those of the previous figure(s). The specific numerals assigned to the elements are provided solely to aid in the description and are not meant to imply any limitations (structural or functional or otherwise) on the described embodiment. It will be appreciated that for simplicity and clarity of illustration, elements illustrated in the figures have not necessarily been drawn to scale. For example, the dimensions of some of the elements are exaggerated relative to other elements.

It is understood that the use of specific component, device and/or parameter names, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that term is utilized.

As further described below, implementation of the functional features of the disclosure described herein is provided within processing devices and/or structures and can involve use of a combination of hardware, firmware, as well as several software-level constructs (e.g., program code and/or program instructions and/or pseudo-code) that execute to provide a specific utility for the device or a specific functional logic. The presented figures illustrate both hardware components and software and/or logic components.

Those of ordinary skill in the art will appreciate that the hardware components and basic configurations depicted in the figures may vary. The illustrative components are not intended to be exhaustive, but rather are representative to highlight essential components that are utilized to implement aspects of the described embodiments. For example, other devices/components may be used in addition to or in place of the hardware and/or firmware depicted. The depicted example is not meant to imply architectural or other limitations with respect to the presently described embodiments and/or the general invention. The description of the illustrative embodiments can be read in conjunction with the accompanying figures. Embodiments incorporating teachings of the present disclosure are shown and described with respect to the figures presented herein.

In the description of each of the following figures, reference is also made to specific components illustrated within the preceding figure(s). Similar components are presented with the same reference number and some components may be provided with a subscripted reference number (e.g., 100*a*, 100*b*) to represent a same component/device being shown in a different context/configuration.

FIG. 1 presents a block component diagram of an electronic device configured with a modifiable exterior rear panel and integrated electronics that dynamically modifies a texture of the exterior panel to prevent device slippage and provide protection of the device from falling, according to one or more embodiments. Electronic device 100 can be one of a host of different types of devices, including but not limited to, a mobile cellular phone, satellite phone, or smart phone, a laptop, a netbook, an ultra-book, a networked smartwatch or networked sports/exercise watch, and/or a tablet computing device or similar device that has an exterior panel as a part of a housing structure. Electronic device 100 can be a communication device that includes/supports wireless communication functionality. As a device supporting wireless communication, communication device 100 can be utilized as, and also be referred to as, a system, device, subscriber unit, subscriber station, mobile station (MS), mobile, mobile device, remote station, remote terminal, user terminal, terminal, user agent, user device, a Session Initiation Protocol (SIP) phone, a wireless local loop (WLL) station, a personal digital assistant (PDA), computer workstation, a handheld device having wireless connection capability, a computing device, or other processing devices.

With continued reference to FIG. 1, electronic device 100 includes controller 110, which includes processor subsystem 112, which controls operations of electronic device 100. Communication device 100 also includes memory subsystem 120, data storage subsystem 130, input/output (I/O) subsystem 140, and communications subsystem 102. Each subsystem is communicatively connected to controller 110 via system interlink 115 enabling controller 110 to manage the functions of the individual subsystems. System interlink 115 represents internal components that facilitate internal communication by way of one or more shared or dedicated internal communication links, such as internal serial or parallel buses. As utilized herein, the term "communicatively coupled" means that information signals are transmissible through various interconnections, including wired and/ or wireless links, between the components. The interconnections between the components can be direct interconnections that include conductive transmission media or may be indirect interconnections that include one or more intermediate electrical components. Although certain direct interconnections (i.e., system interlink 115) are illustrated in FIG. 1, it is to be understood that more, fewer, or different interconnections may be present in other embodiments. For example, a direct 1-to-1 connection can be established between controller 110 and specific ones of the other components within electronic device 100.

Controller 110 includes processor subsystem 112, which includes one or more central processing units (CPUs) or data processors. Processor subsystem 112 can include one or more digital signal processors that can be integrated with data processor(s). Processor subsystem 112 can include other processors such as auxiliary processor(s) that may act as a low power consumption, always-on sensor hub for physical sensors. Controller 110 manages, and in some instances directly controls, the various functions and/or operations of electronic device 100. These functions and/or operations include, but are not limited to including, application data processing, communication with second communication devices, navigation tasks, image processing, and signal processing. In one or more alternate embodiments, electronic device 100 may use hardware component equivalents for application data processing and signal processing. For example, electronic device 100 may use special purpose hardware, dedicated processors, general purpose computers, microprocessor-based computers, micro-controllers, optical computers, analog computers, dedicated processors and/or dedicated hard-wired logic.

Memory subsystem 120 includes operating system (OS) 123, firmware interface, such as basic input/output system (BIOS) or Uniform Extensible Firmware Interface (UEFI), and firmware 124, which also includes code and may thus be considered as program code 122. Memory subsystem 120 stores program code 122 for execution by processor subsystem 112 to provide the functionality described herein. Program code 122 includes applications such as communication application 125, which is used for enabling device communication with an external network and second devices. According to one aspect of the disclosure, program code 122 includes Device Anti Slip/Fall Mitigation (DASM) Module 126 and other applications 128. These applications may be software or firmware that, when executed by controller 110, configures electronic device 100 to provide the functionality described herein. In one or more embodiments, several of the described aspects of the present disclosure are provided via executable program code of DASM module 126 executed by controller 110. In one or more embodiments, program code 122 may be integrated into a distinct chipset or hardware module as firmware that operates separately from executable program code. Portions of program code 122 may be incorporated into different hardware components that operate in a distributed or collaborative manner. Implementation of program code 122 may use any known mechanism or process for doing so using integrated hardware and/or software, as known by those skilled in the art.

Program code 122 may access, use, generate, modify, store, or communicate computer data 138, such as configurable casing (panel) data 139. Computer data 138 may incorporate "data" that originated as raw, real-world "analog" information that consists of basic facts and figures. Computer data 138 includes different forms of data, such as numerical data, images, coding, notes, and financial data. Computer data 138 may originate at electronic device 100 or be retrieved by electronic device 100 from a second device, such as network server (not shown), to which electronic device 100 can communicatively connect via communications subsystem 102. Electronic device 100 may store, modify, present, or transmit computer data 138.

Data storage subsystem 130 of electronic device 100 includes data storage device(s) 132, which are nonvolatile storage. Controller 110 is communicatively connected, e.g., via system interlink 115, to data storage device(s) 132. Data storage subsystem 130 provides program code 122 and computer data 140 that can be loaded into memory subsystem 120 for execution/processing by controller 110. In one or more embodiments, data storage device(s) 148 can include hard disk drives (HDDs), optical disk drives, and/or solid-state drives (SSDs), etc. Data storage subsystem 130 of electronic device 100 can include removable storage device(s) (RSD(s)) 134, which is received in RSD interface 136. In one or more embodiments, RSD 134, encoded with program code and corresponding data, is a non-transitory computer program product or computer readable storage device. Controller 110 can access data storage device(s) 132 or RSD 134 to provision electronic device 100 with program code 122 and computer data 138.

I/O subsystem 140 may include input devices 142 such as microphone 144, image capturing devices (or cameras) 146, and touch input devices 148 (e.g., touch screens, keys or buttons). I/O subsystem 140 may include output devices 150 such as display(s) 152, audio output devices 154, lights 156, and vibratory or haptic output devices 158.

Communications subsystem 102 includes transceivers and modems for enabling wireless (over-the-air (OTA) cellular) network communication and local network communication via one or more antennas in antenna subsystem 103. In one or more embodiments, controller 110, via communications subsystem 102, performs localized wireless communication, such as by using a Bluetooth communication module 104, or other near field communication module 105, or WiFi module 107 to establish personal access network (PAN) connections with external devices. In one or more embodiments, communications subsystem 102 includes global positioning system (GPS) module 106 that receives GPS broadcasts from GPS satellites to obtain geospatial location information. In one or more embodiments, controller 110, via communications subsystem 102, communicates via a wireless local area network (WLAN) link, using one or more IEEE 802.11 WLAN protocols with a localized access point. In one or more embodiments, controller 110, via communications subsystem 102, may communicate via an OTA cellular connection with radio access networks (RANs).

Figure 2A:
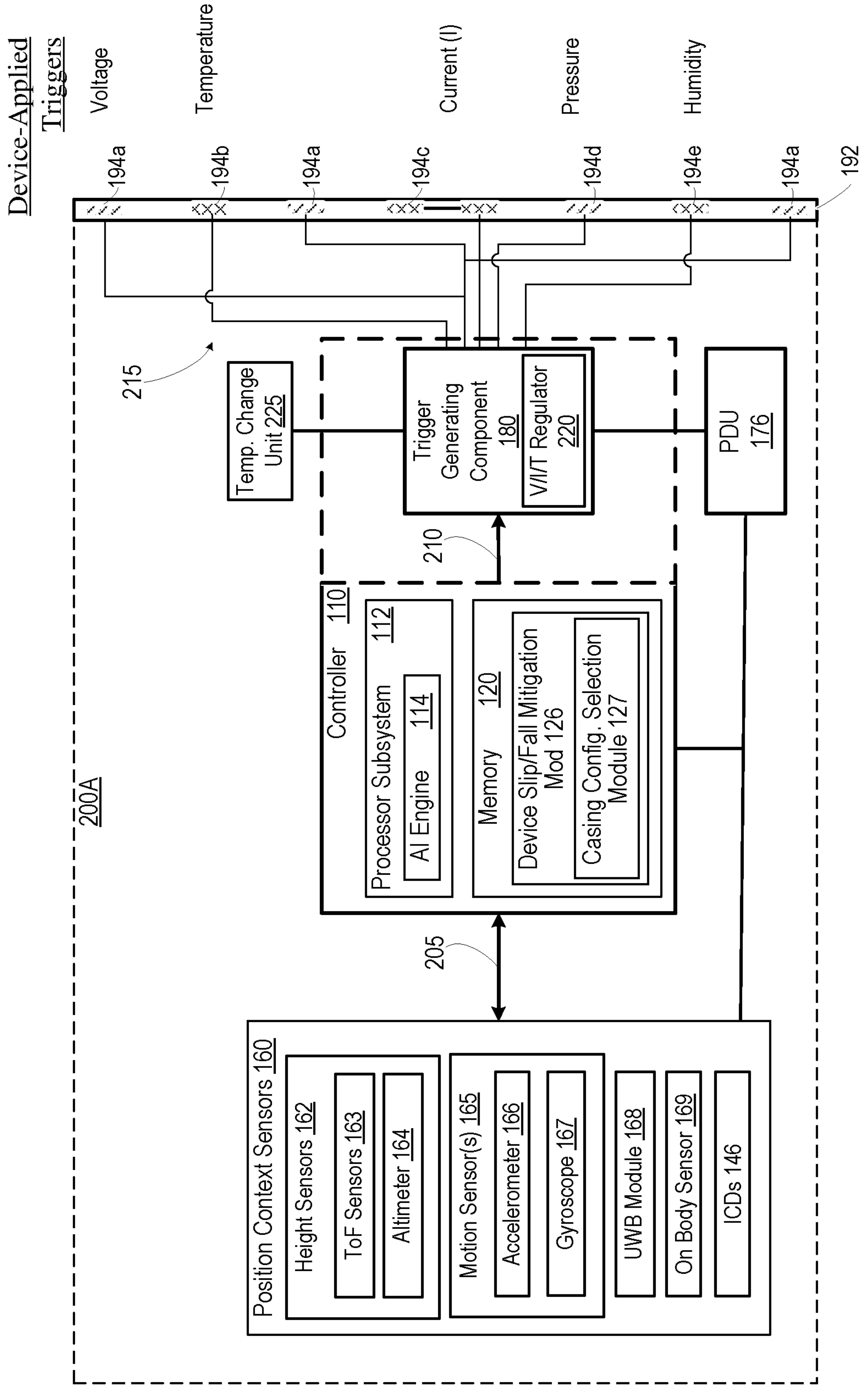
FIGS. 2A-2B are block diagrams illustrating interconnected device components, including sensors and a trigger generating component, for triggering the dynamic modification of the exterior rear panel of the electronic device in response to sensed support conditions, according to one or more embodiments.
Figure 2B:
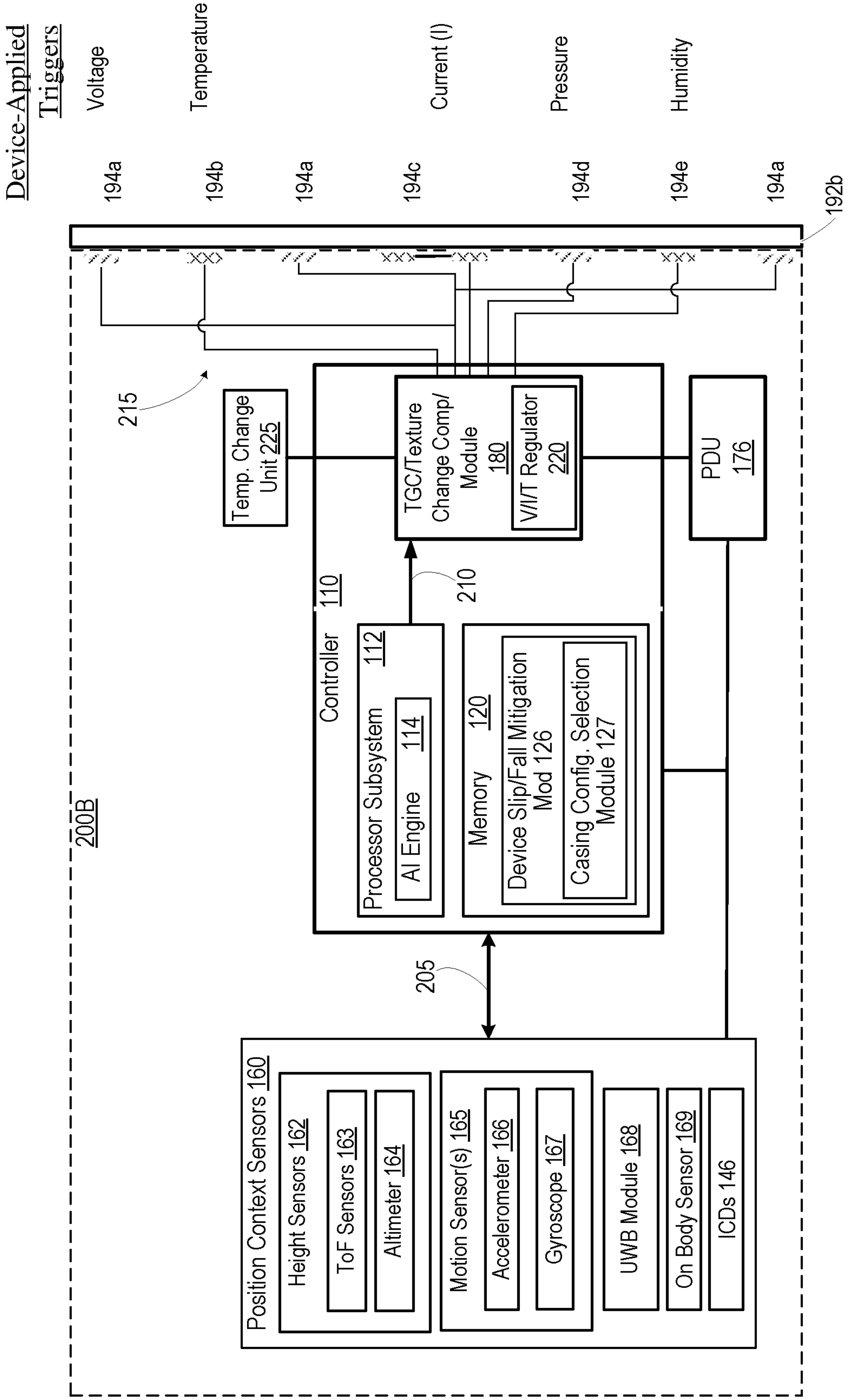

The remaining features of FIG. 1 will be described with reference also to FIGS. 2A-2B. FIG. 2A-2B are block diagrams illustrating interconnected device components, including sensors and a trigger generating component, for triggering the dynamic modification of the exterior rear panel of the electronic device in response to sensed support conditions, according to one or more embodiments. According to one aspect of the disclosure, electronic device 100/200A also includes a plurality of device positioning context sensors 160, which can be utilized to identify a special position of the device, such as when in an elevated position, when perched on a ledge or edge of an object, when falling, etc. Device positioning context sensors 160 can include height sensors 162, such as a time of flight (ToF) sensor 163 and an altimeter 164, and motion sensors 165 such as an accelerometer 166 and a gyroscope 167. Motion sensor(s) 165 can detect movement of electronic device 100 and provide motion data to processor 102 indicating the spatial orientation and movement of electronic device 100. Accelerometer(s) 166 measure linear acceleration of movement of electronic device 100 in multiple axes (X, Y and Z). Gyroscope 167 measures rotation or angular rotational velocity of electronic device 100. Device positioning context sensors 160 can also include an ultrawideband (UWB) transceiver 168, which can detect a relative location of the device based on signals received from surrounding UWB tags or devices at known locations in the surrounding environment. Device positioning context sensors 160 can also include on-body detection sensor 169 to identify when the device is being held in a user's hand versus being stored in a pocket or located away from the user. Other types and/or different ones of device positioning sensors 160 are also supported.

Electronic device 100 also includes a physical interface 170 to which is coupled a charging circuitry 172 for charging device battery 175. Device battery 175 is coupled to power distribution unit (PDU) 176, which distributes power (voltage and current distribution) to the various components of electronic device 100 that require electrical power. Physical interface 170 also functions as a data port for transmitting data (using data cable connector to system interlink 115) to and from electronic device via an attached cable (not shown) that interfaces with physical interface 170.

Electronic device 100 includes an exterior housing 190 that generally includes a rear panel 192 made of a material or composite that can be dynamically changeable by exposure to one or more device-generated triggers. According to one or more embodiments, the material or composite that is used to manufacture the rear panel 192 can include one or more surface texture changing elements 194 that can individually or collectively cause a change in the exterior texture of the rear panel material. In the illustrated embodiments of FIGS. 3-7, the change to the texture is presented as a visible change; However, it is appreciated that the change in texture may not be visible to the naked eye, but can be a change that is noticeable to touch and can be felt on the surface of the panel. For example, the texture of the rear panel may transition from a smooth, slippery texture to a more rough, non-slippery texture when the device is held in a user's hand.

With specific reference to FIGS. 2A-2B, the figure presents several components that are the same components as those described above for FIG. 1. The description of FIGS. 2A-2B will thus focus primarily on the new features incorporated by FIGS. 2A-2B. According to the disclosure, the electronic device 200A/200B (collectively 200) includes at least one external surface (rear panel 192) comprised of a material whose texture can be dynamically changed based on exposure to a parameter (or change in a parameter) caused by a device-generated trigger. As listed to the right of the schematic diagram of FIG. 2A, the parameters or parameter change that result from the device-generated trigger(s) can include application of at least one of a voltage, a pressure, a current, a temperature, or a humidity to the material. According to one aspect of the disclosure, electronic device 200 is further configured with trigger generating component 180 that responds to receipt of a control signal 210 from processor subsystem 112 by activating one or more device-generated triggers 215 that cause or results in modification of the exterior texture of the rear panel material (192). In one or more alternate embodiments, as more clearly presented by FIG. 2B, the component 180 can be incorporated within the controller 110 and can operate as a texture change component/module 180 of controller 110. Texture change component (or module) 180 then receives a signal 210 from processor subsystem 112, which is the component within controller 110 that performs all of the prior determinations of the support condition and whether a change in texture is required, based on received sensor inputs. This signal 210 can, in some embodiments, be considered or defined to be the device-generated trigger, as the signal 210 automatically triggers texture change component/module 180 to implement processes that result in modifying the texture of the external surface material. Alternatively, as presented herein, controller 110, acting via texture change component/module 180, provides the device-generated trigger 215, which is transmitted to the surface changing elements 194 that cause the change in the texture of the external surface material.

According to one or more embodiments and as illustrated by the figure, the modification of the exterior texture of rear panel material (192) can be based on the rear panel being manufactured with surface texture changing elements 194*a*-194*e* embedded in, integrated into, or affixed to an interior section of rear panel 192. Each different surface changing element 194*a*-194*e* responds to a specific one of the device-generated or device-applied triggers 215.

FIG. 2B presents an alternate embodiment in which the surface changing elements 194*a*-194*e* are a part of the internal circuitry of the electronic device 200B. The rear panel 192 is manufactured with a composite material that has specific qualities which results in the change in the texture of the external surface of the rear panel whenever a specific trigger is applied to, on, or in proximity to the internal surface of the rear panel 192*b*. With this embodiment, different types of rear panels having different characteristics can be added to the electronic device to provide different responses to the applied triggers.

Electronic device 200 includes at least one sensor that detects a support condition of the electronic device. In the illustrative embodiments, the at least one sensor are incorporated as the position context sensors 160. According to one or more embodiments, the at least one sensor comprises one or more sensor from among an accelerometer, a gyroscope, a gyrometer, an altimeter, a barometer, and an on-body detection sensor 169. As also presented, one or more embodiments provide that the device image capturing devices (ICDs) 146 can be included within and utilized as one of position context sensors 160. FIG. 5B provides one example scenario that can involve the use of the ICDs as a position context sensor(s) 160. It is appreciated that the specific sensors used and manner in which each can be used to determine the support condition of the electronic device can vary from each device. Different sensors and/or combinations of sensors can be supported, in other embodiments.

Electronic device 100 includes controller 110 communicatively coupled to the at least one sensor (160) and to trigger generating component 180 that provides the device-generated trigger(s) 215. Controller 110 receives, from the at least one sensor (160), sensor input 205 corresponding to the support condition and evaluates the received sensor input 205 to determine whether a current support condition is one that which triggers the controller to cause a change in the texture of the external surface material of the rear panel 192 in order to enhance protection of the device from falling or being damaged by a fall. In response to determining that the current support condition is one that triggers the change in the texture of the external surface material (192) to enhance protection of the device, controller 110 transmits a signal to the component 180 to activate the component 180 to provide the device-generated trigger 215, causing a change in the texture of the material of the at least one external surface of rear panel 192.

In one or more embodiments, an amount or degree of relative change in the texture of the material is determined by the corresponding level of the voltage, pressure, current, temperature, or humidity applied to the material. The processor determines the corresponding level of the voltage, pressure, current, temperature, or humidity to be applied to the material, based on the current support condition of the electronic device and the amount of relative change required to the external surface material that mitigates or substantially reduces a risk of the electronic device falling or being damaged from falling, given the current support condition. The processor encodes the corresponding level in the control signal (210) transmitted to the component.

In one or more embodiments, the trigger generating component 180 can include circuitry for selection of a specific one of the triggers 215 based on the received control input/signal 210. As an example, to support application of a current or voltage or temperature (heat) as the trigger, the component 180 can include a voltage/current/temperature regulator 220. Component 180 applies a particular voltage or current to the rear panel to cause the current/voltage/temperature characteristics of the rear panel material to change, resulting in the change in the surface texture of the material. The temperature change can be generated via a temperature change unit 225, which in one embodiment can be a heat generating component, such as a resistor, placed proximate to the interior of the rear panel 192 and receiving an applied current or voltage, which causes an increase in the temperature of the heat generating component.

In one or more embodiments, the trigger generating component includes multiple sub-components that each correspond to a different one of the device-generated triggers 194*a*-194*e*. Also, each different device-generated trigger produces a different change in the texture of the material. Accordingly, the processor selects which one of the multiple sub-components is utilized, based on the current support condition of the device and an amount and type of change desired for the texture of the material, and the processor encodes the selection in the control signal 210 transmitted to the trigger generating component.

According to one embodiment, the processing of the received sensor input 205 and determinations related to changing the rear panel texture are performed by a dedicated artificial intelligence (AI) engine 114 within or associated with processor subsystem 112. AI engine 114 can utilize empirical data to evaluate the received sensor inputs 205 and determine if the device is at a risk of slipping or falling based on a current support context. AI engine 114 can also utilize configurable casing data 139 to decide which parameter signal 210 is required to cause the desired modification in the rear panel surface material to counteract the detected risk based on the determined support condition. AI engine 114 generates a corresponding control input 210 that is sent to the texture change component 180 to cause the component 180 to provide the correct trigger 215. It is appreciated that the features can be performed by the processor subsystem 110 using program code stored in memory 120. Examples of program code include Device Anti Slip/Fall Mitigation Module 126, which can include a casing configuration selection module 127 that utilizes the configurable casing data 139 in making the determination of which trigger to provide.

According to one or more embodiment, the material of the at least one external surface (192) is changeable into multiple different textures each triggered by one of multiple device-generated triggers 215 that is provided by the component 180, a selected trigger among the multiple device-generated triggers being identified by the controller 110 based on characteristics of the current support condition. The controller transmits a corresponding trigger-identifying signal 210 to trigger generating component 180 to provide the selected trigger 215 and cause the change of the texture of the material to a specific one of the multiple different textures. While described as having multiple different textures, it is appreciated that one or more embodiments may provide for only a single change of the texture of the material, and that the determination of the trigger is a singular decision of whether or not the support condition warrants a change from the original texture to the single second texture supported by the material.

FIGS. 3A-3D presents four example rear side views of the electronic device with different texturing of the rear panel, according to multiple embodiments. Beginning with FIG. 3A, electronic device 100*a* is presented as a smart phone having an exterior housing that consists of a display 152 on the front side of the device 100*a* and a rear panel 192 on a back side of the device 100*a*. Electronic device 100 includes adjoining side panels, with one side panel having volume control buttons 305*a*-305*b* and a control button 306, which can be used to power the device on/off, place the device in sleep or active mode, or control a feature or function of the device, such as taking a picture. Rear surface of electronic device includes a set of image capturing devices 315 located at a top corner of the rear surface, separate from the rear panel 192. Rear panel 192 is shown in a base state, with a first (standard/base) texture 320*a*, in which the surface material appears smooth and sleek to the touch.

Figure 3A:
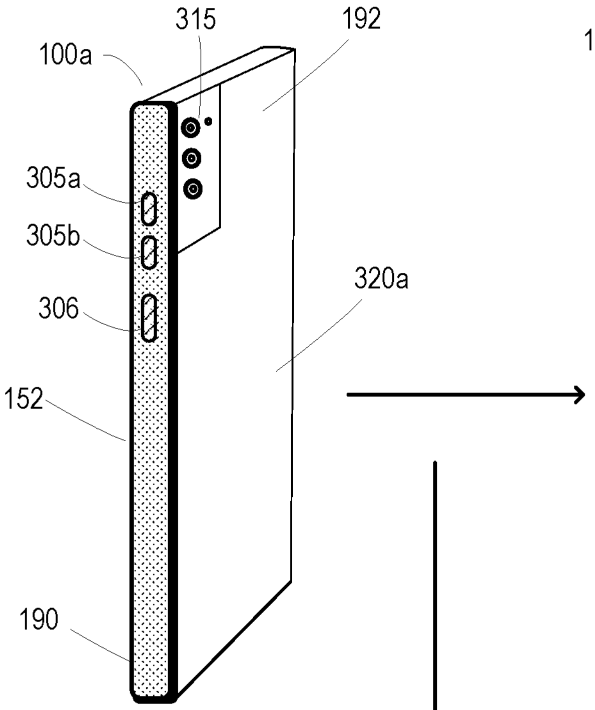
FIGS. 3A-3D present four example rear side views of the electronic device with different texturing of the rear panel, according to multiple embodiments.
Figure 3B:
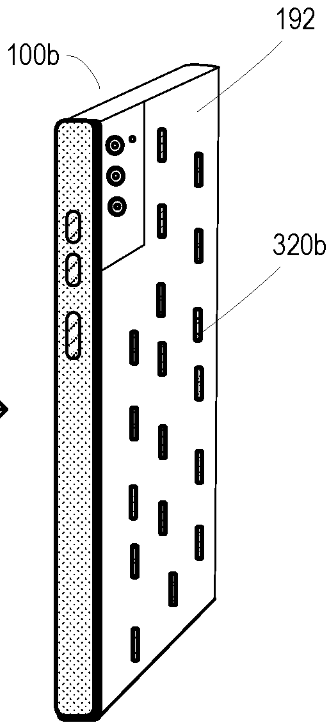
Figure 3C:
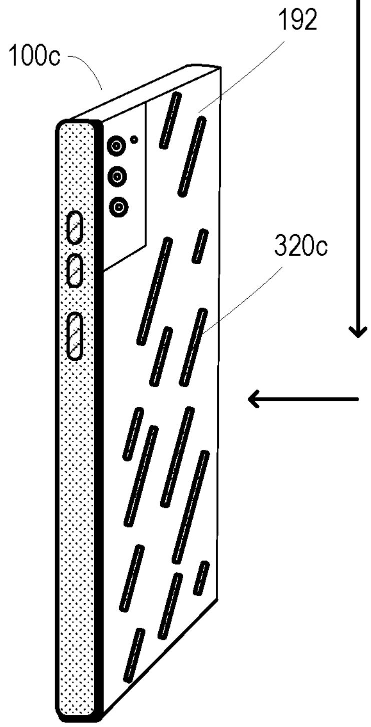
Figure 3D:
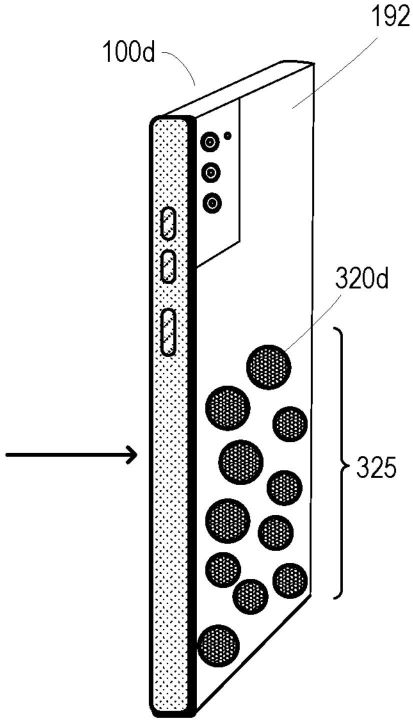

FIG. 3B presents a second embodiment of electronic device 100*b* in which a texture of the material of rear panel 192 has been changed to present a second texture 320*b* that appears in a dashed linear pattern vertically up the exterior surface of the rear panel 192. FIG. 3C presents a third embodiment of electronic device 100*c* in which the texture of the material of rear panel 192 has been changed to present a third texture 320*c* that appears in a diagonal linear pattern from a left side towards the right side of the exterior surface of the rear panel 192. FIG. 3D presents a fourth embodiment of electronic device 100*d* in which the material texture of a bottom section 325 of rear panel 192 has been changed to present a fourth texture 320*d* that appears as rounded protrusions of differing diameters on the lower exterior surface of the rear panel 192. In FIG. 3D, the bottom section 325 represents the section of the electronic device 100*d* that a user grips while using a thumb to interface with the display side of the electronic device 100*d*. The different textures presented by FIGS. 3A-3D are example textures and not meant to limit the type, location, or other characteristics of the texture that can be applied to the rear panel material. In one or more embodiments, each of the second, third, and fourth textures 320*b*-320*d* are temporarily triggered in response to the device controller (or AI engine) determining that the particular texture is required to prevent the device from slipping or falling from the current hand-held or placed position (i.e., (on an elevated object). Also, the controller removes or reverses the trigger when the support condition changes, in order to cause the device to revert the rear panel material back to the first texture 320*a*. In one or more embodiments, the controller receives an updated support condition and evaluates whether the updated support condition of the device still requires the texture to be applied to the external surface material for the electronic device to not be at risk of falling or being damaged from falling. In response to receiving the updated support condition and determining that the added texture is no longer required, the controller generates and transmits a second signal to the component to cause the component to change the texture of the material back to a base texture (320*a*). The component provides a fourth device-generated trigger causing a reverse change in the texture of the material to the base (first) texture (320*a*). Alternatively, in one or more embodiments, the component removes the first device generated trigger, which removal causes the reverse change in texture of the material to the base texture (320*a*).

Figure 4A:
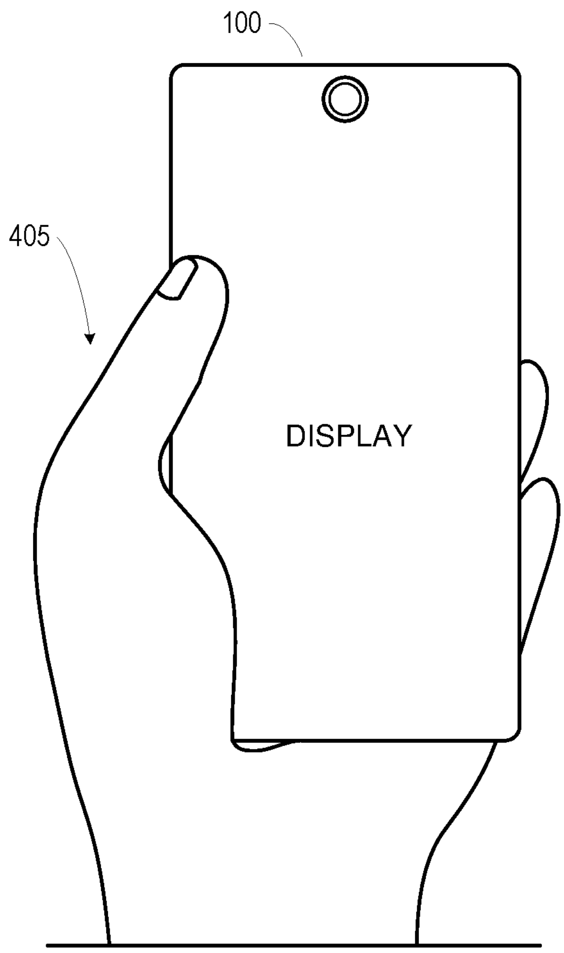
FIGS. 4A-4C present a first example scenario of the electronic device modifying the texture of the rear panel responsive to sensing a potential slipping of the device from a user's hands, according to one or more embodiments.
Figure 4B:
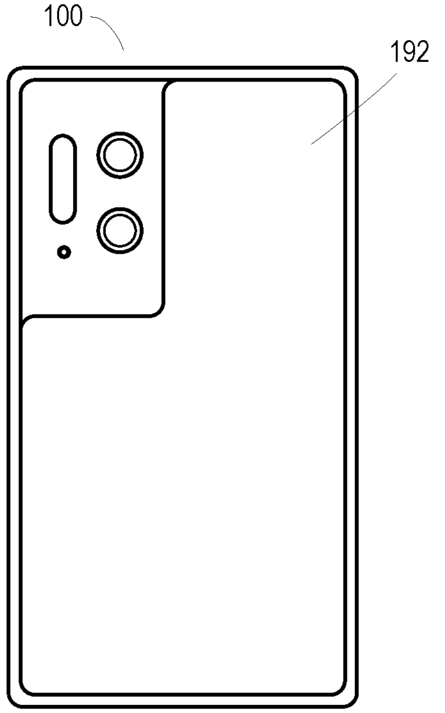
Figure 4C:
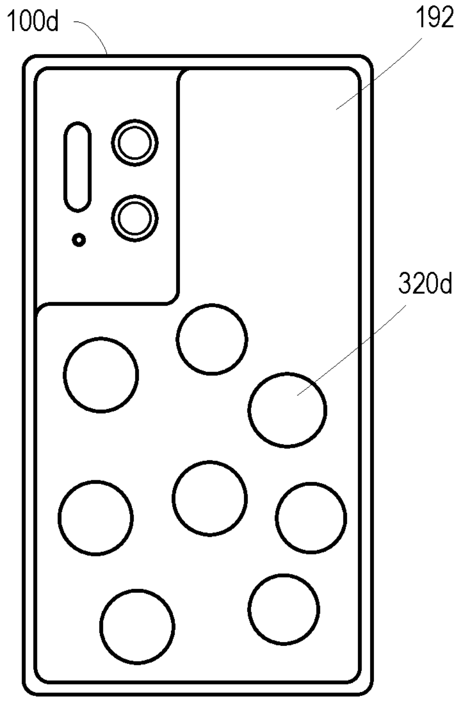

FIGS. 4A-4C present a first example scenario of the electronic device 100 modifying the texture of the rear panel 192 responsive to sensing a potential slipping of the device from a user's hands 405, according to one or more embodiments. In FIGS. 4A and 4B, the user is holding the electronic device 100 such that the fingers of the user at touching the rear surface (192) of the electronic device. The user's hands may be moist from a liquid resulting in the device being slippery to the touch of the user's fingers. The support condition is associated with the user's grip on the surface material of the device. The moist condition of the user's hands is detected by a moisture detecting sensor of the electronic device, which is monitored by the device controller 110. The controller may also determine that the electronic device is in an elevated state, based on monitoring feedback from one or more height sensors, such as an altimeter. In response to the detection of the moisture on the user's fingers, the controller determines that there is a potential for the electronic device 100 to slip out of the user's hand and fall to the ground, potentially damaging the device. The controller responds to this determination by transmitting a control signal to the trigger generating component 180 to cause the component to generate an appropriate trigger to change the texture of at least a portion of the rear panel 192 to a less slippery texture. FIG. 4C illustrates the resulting change in the texture of the bottom section 325 of the rear panel 192 of electronic device 100*d* from the smooth, first texture 320*a* to the rough, fourth texture 320*d* (FIG. 3D).

Thus, as presented by the above-described FIGS. 4A-4C, the electronic device 100 includes a housing that has the at least one external surface as a back side of the housing and a display embedded within a front surface of the housing and communicatively coupled to the controller. The controller includes a processor communicatively coupled to a memory, which stores program code that is processed by the processor for: evaluating the support condition of the electronic device based on the sensor information received from the at least one sensor; and generating a corresponding signal for triggering the change in the texture of the material of the at least one external surface, based on the determined support condition.

According to the above-described example embodiment, the support condition corresponds to whether the electronic device is at a risk of falling or slipping or dislocating from an elevated position. And in response to the current support condition indicating that the electronic device is at a risk of falling or slipping or dislocating from an elevated position, the controller 110 transmits a first trigger-identifying signal to the trigger generating component 180 to configure the component 180 to provide the device-generated trigger that causes the texture of the material to change from a smooth texture to a non-slip texture.

Figure 5A:
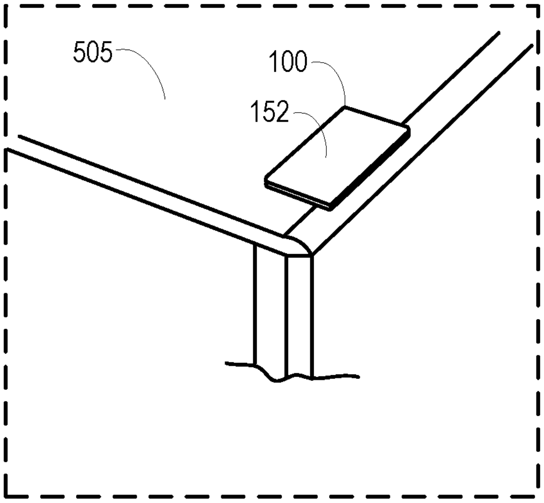
FIGS. 5A-5C illustrate a second example scenario of the electronic device modifying the texture of the rear panel responsive to sensing a potential fall/slipping from an elevated surface, according to one or more embodiments.
Figure 5B:
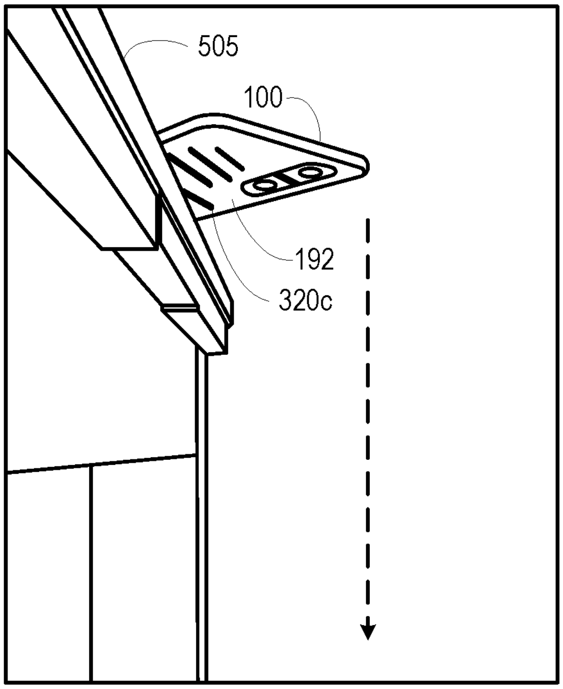
Figure 5C:
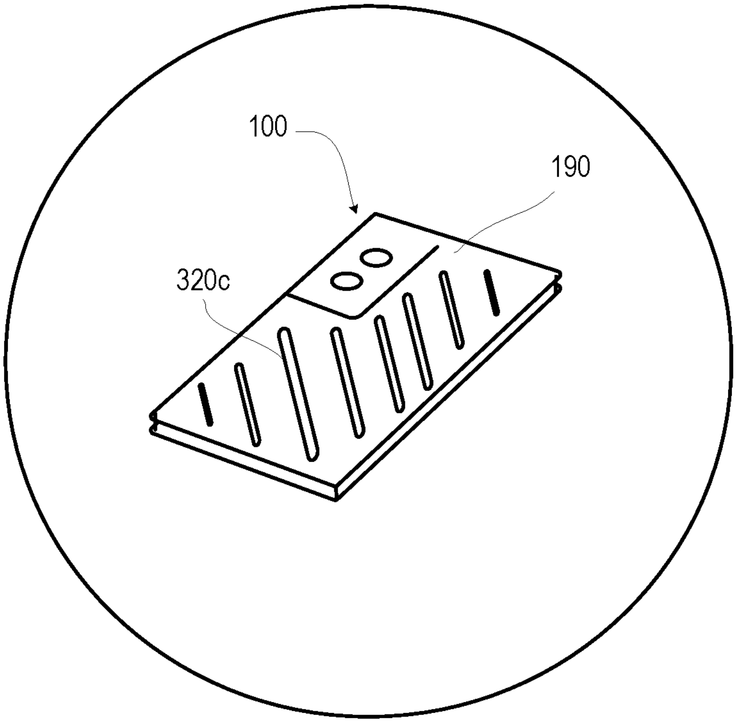

FIGS. 5A-5C illustrates a second example scenario of the electronic device modifying the texture of the rear panel responsive to sensing a potential fall/slipping from an elevated surface, according to one or more embodiments. As illustrated by FIGS. 5A-5B, the electronic device 100 is located on the edge of an elevated surface 505, which can be a table, desk, countertop, or other elevated surface 505. The front side with the display 152 is facing up, while the rear panel 192 is faced downward, at least partially atop and in contact with the elevated surface 505. In FIG. 5B, the device sensors have provided device position data to the controller, which data the controller 110 evaluates to determine that the device is in an elevated position and at risk of falling off the surface 505. The controller 110, based on this determination, sends a control signal to the trigger generating component 180 to cause the component 180 to transmit a trigger to modify the texture of the rear panel to a third texture to help prevent the electronic device from slipping or falling off the elevated surface 505. FIG. 5C illustrates electronic device 100*c* having the third texture 320*c* applied to the rear panel 192. The third texture 320*c* provides additional friction to the surface of the rear panel 192, thus making it less likely that the device 100 will slide/slip off the surface 505.

Figure 6A:
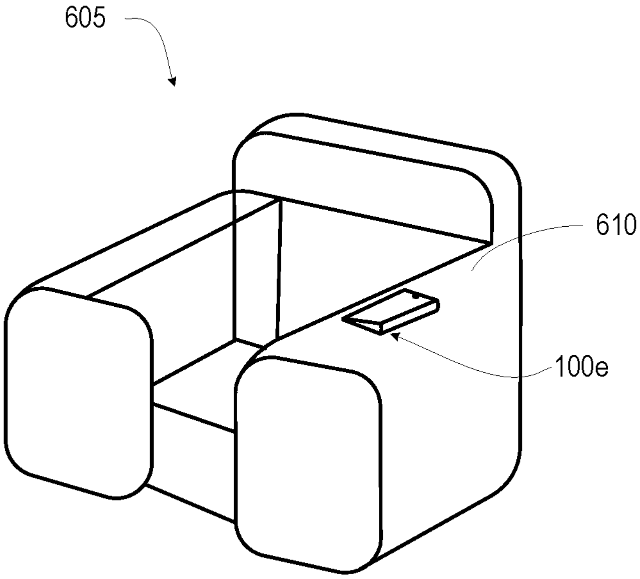
FIGS. 6A-6C illustrates a first example scenario of the electronic device inflating a portion of the material of the rear panel responsive to a potential slipping of the device from a sloped surface, according to one or more embodiments.
Figure 6B:
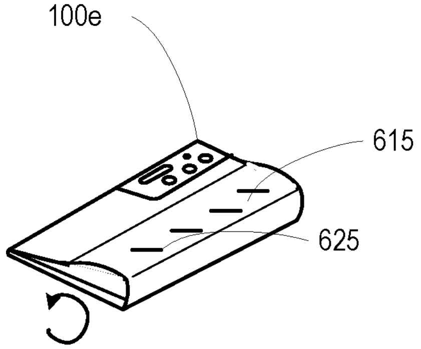
Figure 6C:
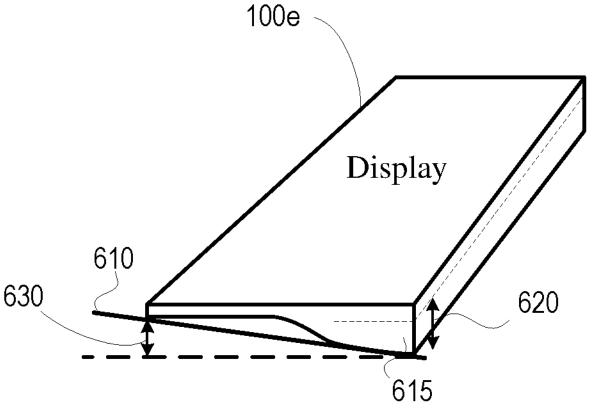

According to one or more embodiments, the change to the rear surface material can involve inflating the material or portions of the material to protect the device. FIGS. 6A-6C illustrates a first example scenario of the electronic device inflating a portion of the material of the rear panel responsive to a potential slipping of the device from a sloped surface, according to one or more embodiments. As shown by FIG. 6A and quantified by FIG. 6C, electronic device is placed display side face-up on a slanted surface 610 of a couch 605, and electronic device 100 is at a risk of slipping off the downward-angled surface 610 of the couch 605. FIG. 6C shows the horizontal dashed line relative to the slope of couch surface 610 on which the electronic device 100 is positioned. In FIG. 6A, controller has caused electronic device 100*e* to change a configuration of the rear panel 192 to compensate for the slope. FIG. 6B shows a more detailed view of the rear panel of electronic device 100*e*, rotated 180 degrees from its support position in FIG. 6A, where controller 110 has triggered texture change component 180 to inflate the right side of electronic device 100. Inflated section (620) of rear panel 192 also includes grooves or texture patterns 625 to provide friction against the slanted surface 610 of the couch 605, thus aiding in preventing the electronic device 100 from slipping. According to one or more embodiments, the amount or magnitude of the inflation is directly correlated to the amount or degree of slant and how much inflated material 615 is required to compensate for the amount of slant 630 in the furniture surface.

Accordingly, in one embodiment, the controller 110 identifies from the received sensor input that the at least one surface of the electronic device 100*e* is located on an elevated, slanted support structure (610) from which the electronic device can tilt and fall. Then, in response to the received sensor input indicating the at least one surface (192) of the electronic device 100*e* is located on the elevated slanted support structure (610) from which the electronic device can tilt and fall, the controller 110 transmits a second trigger-identifying signal to the component 180 causing the component 180 to change the texture of the material to an angled or partially-inflated shape that reduces an angle of the tilt between the at least one surface (192) and the elevated slanted support structure, relative to a horizontal position.

Figure 7:
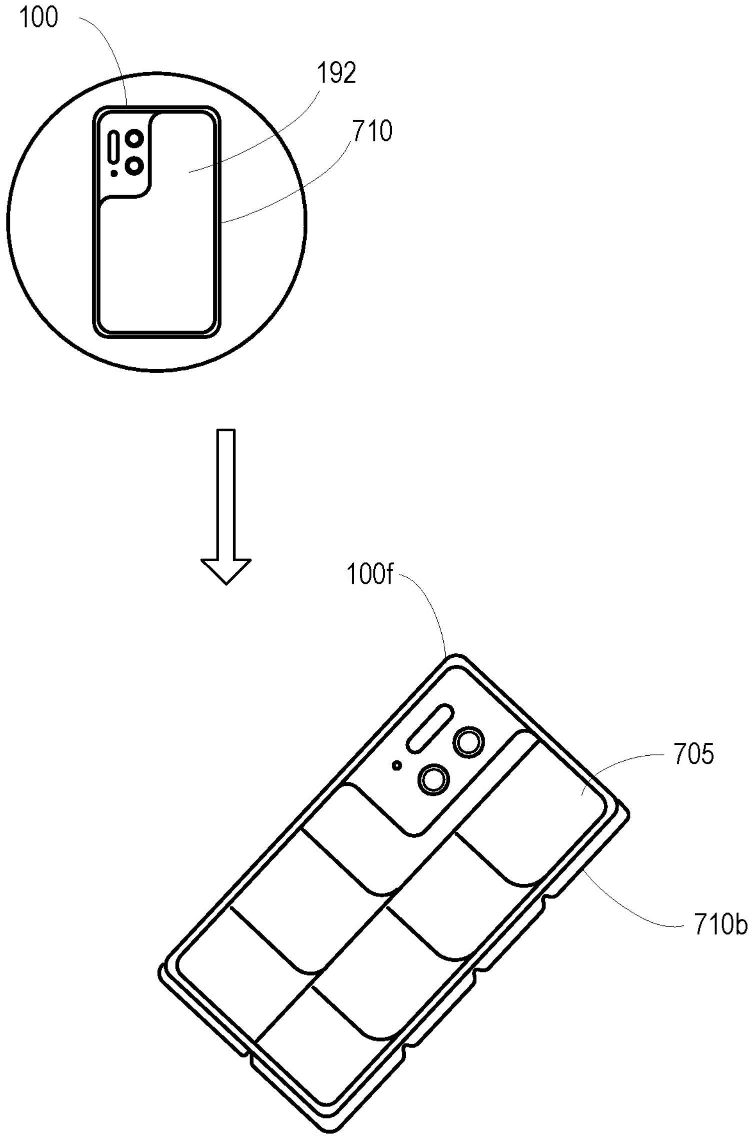
FIG. 7 illustrates a second example scenario of the electronic device inflating a majority of the rear panel material responsive to sensing the device falling, according to one or more embodiments.

FIG. 7 illustrates a second example scenario of the electronic device 100*f* inflating a majority of the rear panel material responsive to sensing the device falling, according to one or more embodiments. In FIG. 7, the controller 110 receives data from the motion sensor(s) indicating the device is falling. In an example, the received data can include data from accelerometer, altimeter, and gyroscope, which collectively provides that the device 100*f* is in a free fall condition. The controller 110 transmits a specific control signal to component 180, which causes the component 180 to trigger the exterior material of the rear panel to inflate into inflated segments 705. Notably, in the presented embodiment, the component 180 also provides a trigger to a side panel 710 of electronic device to cause the side panel to inflate, generating side inflated segments 710*b*.

In a related embodiment, in response to the sensor input indicating the electronic device is falling, the controller transmits a third trigger-identifying signal to the component causing the component to change the texture of the material to a shape that modifies a center of gravity and a rotational axis of the electronic device to cause the electronic device to land on a side covered by the inflated material, which protects the electronic device during a fall of the electronic device from an elevated position.

Additional configurations of the electronic device are supported in one or more alternate embodiments. In another embodiment, the electronic device includes a device housing that encompasses the controller and other functional components and to which the at least one external surface is removably attached. With this embodiment, the device further includes a connection interface that electrically couples the component with the controller, the component being a part of the at least one external surface.

Figure 8A:
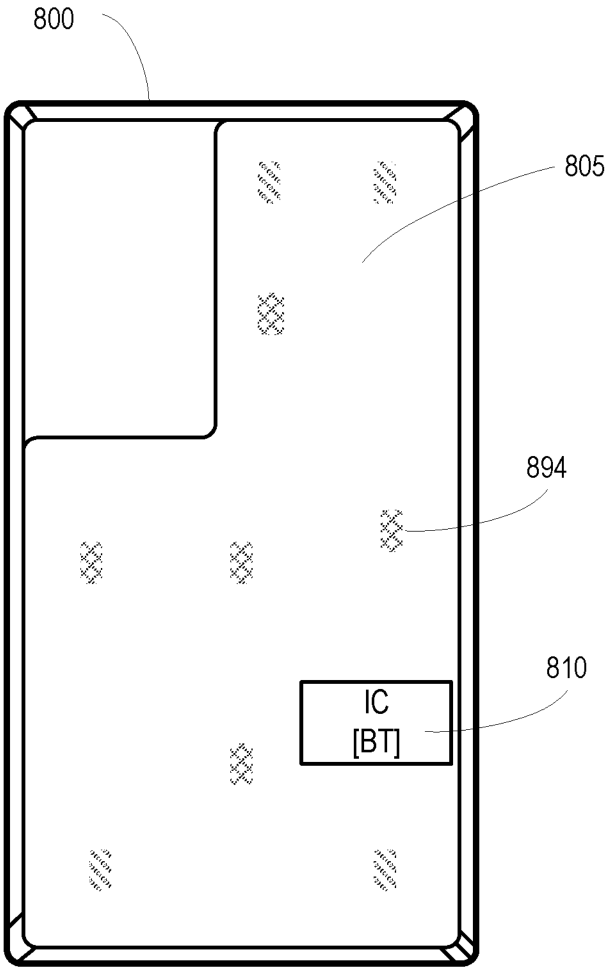
FIGS. 8A-8C illustrate an example exterior casing with embedded electronics that enables a linked portable device to which the casing is attached to trigger dynamic modification of the texture of the exterior material of the casing, in response to device-sensed support conditions, according to one or more embodiments.
Figure 8B:
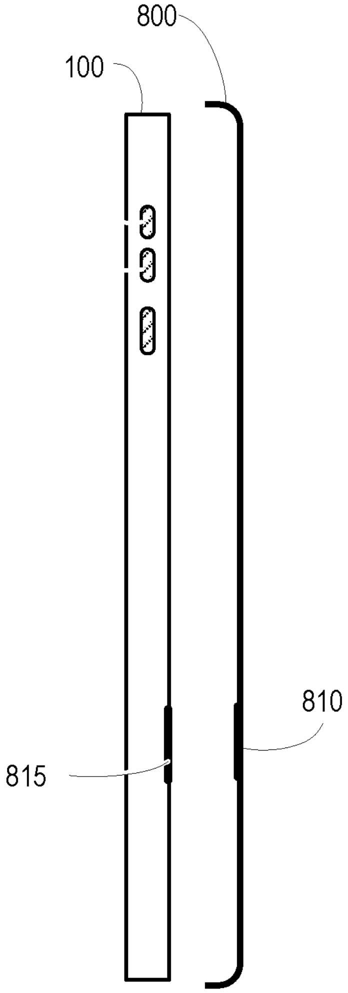
Figure 8C:
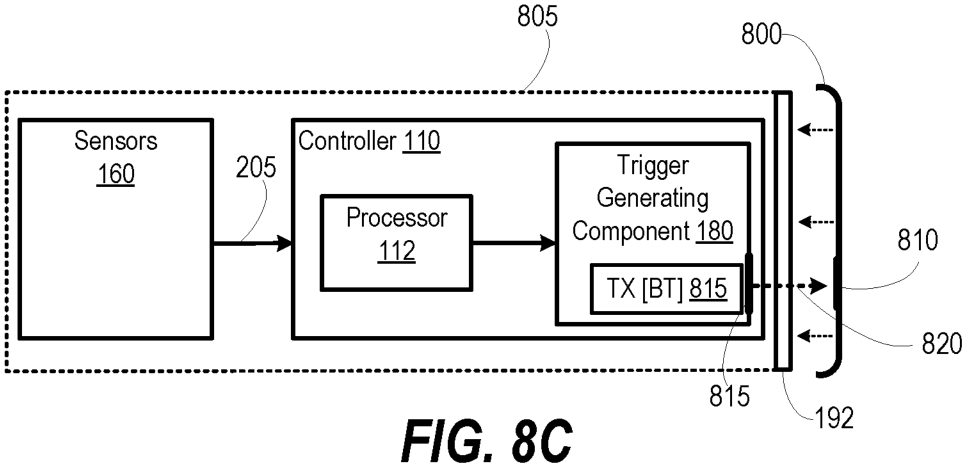

FIGS. 8A-8C illustrate an example exterior casing with embedded electronics that enables a linked portable device to which the casing is attached to trigger dynamic modification of the texture of the exterior material of the casing, in response to device-sensed support conditions, according to one or more embodiments. According to one additional aspect of the disclosure, which is illustrated by FIGS. 8A-8C, an electronic device casing cover 800 is provided that includes an exterior material having a configurable texture that can be changed based on a received device-provided trigger generated in response to a detected support condition of an electronic device 805 on which the electronic device cover is placed. Similar to the previously examples with the integrated rear panel, the received device-provided trigger 820 causes a change in at least one of a voltage, a pressure, a current, a temperature, or a humidity applied to the exterior casing material by the electronic device 805 in response to the detected support condition. As shown with FIG. 8A, the exterior casing cover 800 includes a rear surface 805 with integrated elements 894 that cause the changes in the exterior surface of the casing material. The exterior casing cover 800 also includes an integrated circuit (or electronics) 810 which may be configured with a communication receiving device, such as a Bluetooth receiver for receiving the device-generated trigger from a transmitter device 815, such as a BT transmitter, of trigger generating component 180. With the ability to provide the functionality within an off-the-shelf casing, multiple different types of casing can be provisioned to provide different types of texture changes based on the receipt of the device-generated triggers. FIG. 8B illustrates the exterior casing cover 800 positioned to be affixed to a rear surface of electronic device 805, with the device transmitter (815) and receiver module (810) in proximity to each other. FIG. 8C presents a block diagram of the device components with internal sensors 160 and with controller 110 having trigger generating (or texture change) component 180 that includes the transmitter 815. Electronic device 805 includes rear panel 192 of device casing. External casing cover 800 is positioned to be placed over the rear panel 192 in the direction of the dotted arrows, aligning receiver (810) with transmitter 815 to enable wireless communication of texture change signal 820 from device controller 110 to external casing cover 800.

Accordingly, one additional aspect of the disclosure provides an electronic device cover that includes an exterior material having a configurable texture that can be changed based on a received device-provided trigger generated in response to a detected support condition of an electronic device on which the electronic device cover is placed. In one embodiment, the received device-provided trigger is a change in at least one of a voltage, a pressure, a current, a temperature, or a humidity applied to the exterior material by the electronic device in response to the detected support condition. In an alternate embodiment, the electronic device cover includes electronics for: communicatively coupling the cover to the controller of the electronic device to which the cover is attached; receiving the device-provided signal from the controller of the electronic device, via a transmitter; and triggering the change in the material texture on receipt of the device-provided signal. The controller of the electronic device is communicatively connected to a transmitter that is paired to the electronics embedded in the electronic device cover.

Figure 9:
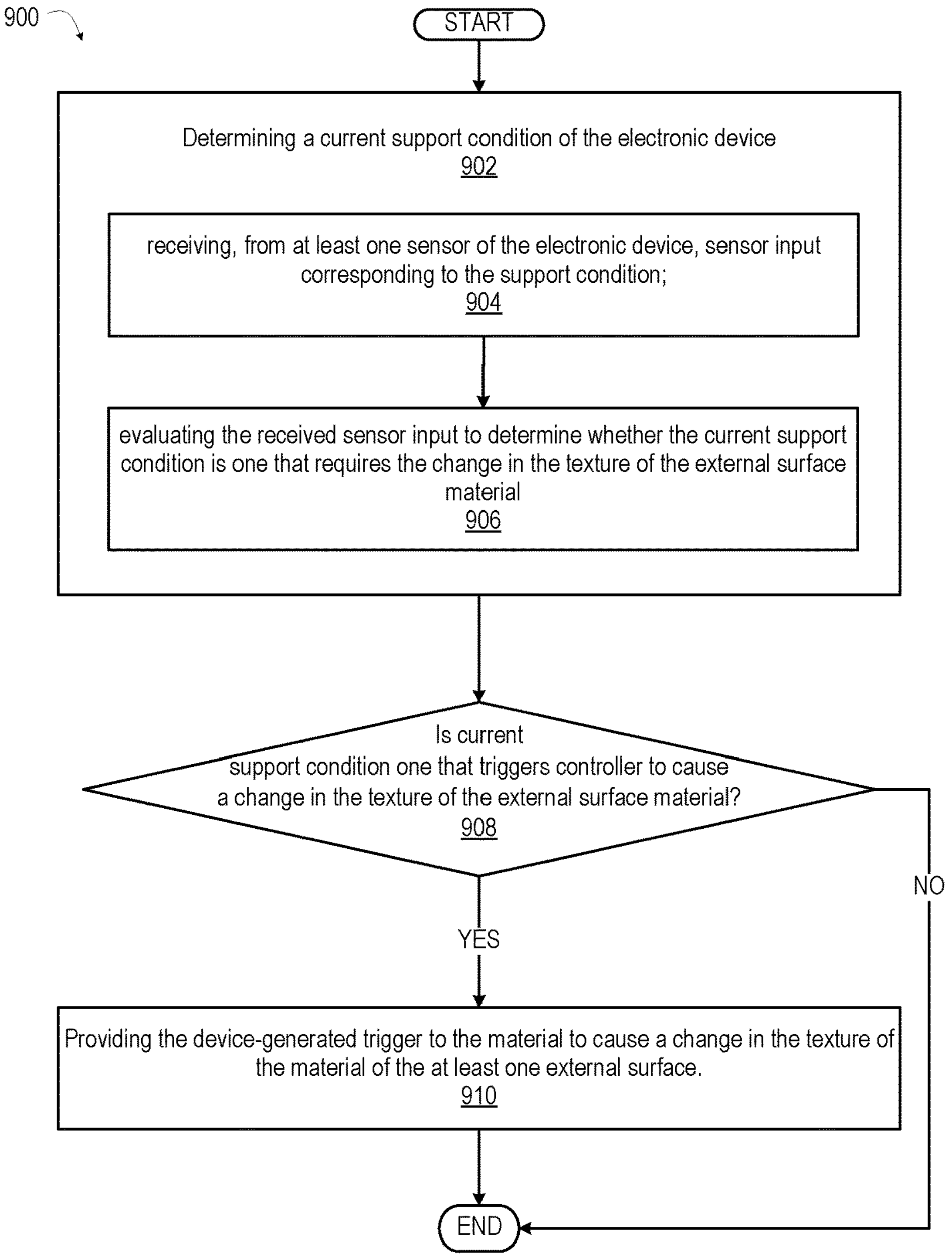
FIG. 9 is a flow diagram presenting a method performed by a portable electronic device for dynamically modifying the texture of the material of an exterior rear panel to prevent and/or protect the electronic device from slipping or falling, according to one or more embodiments.
Figure 10:
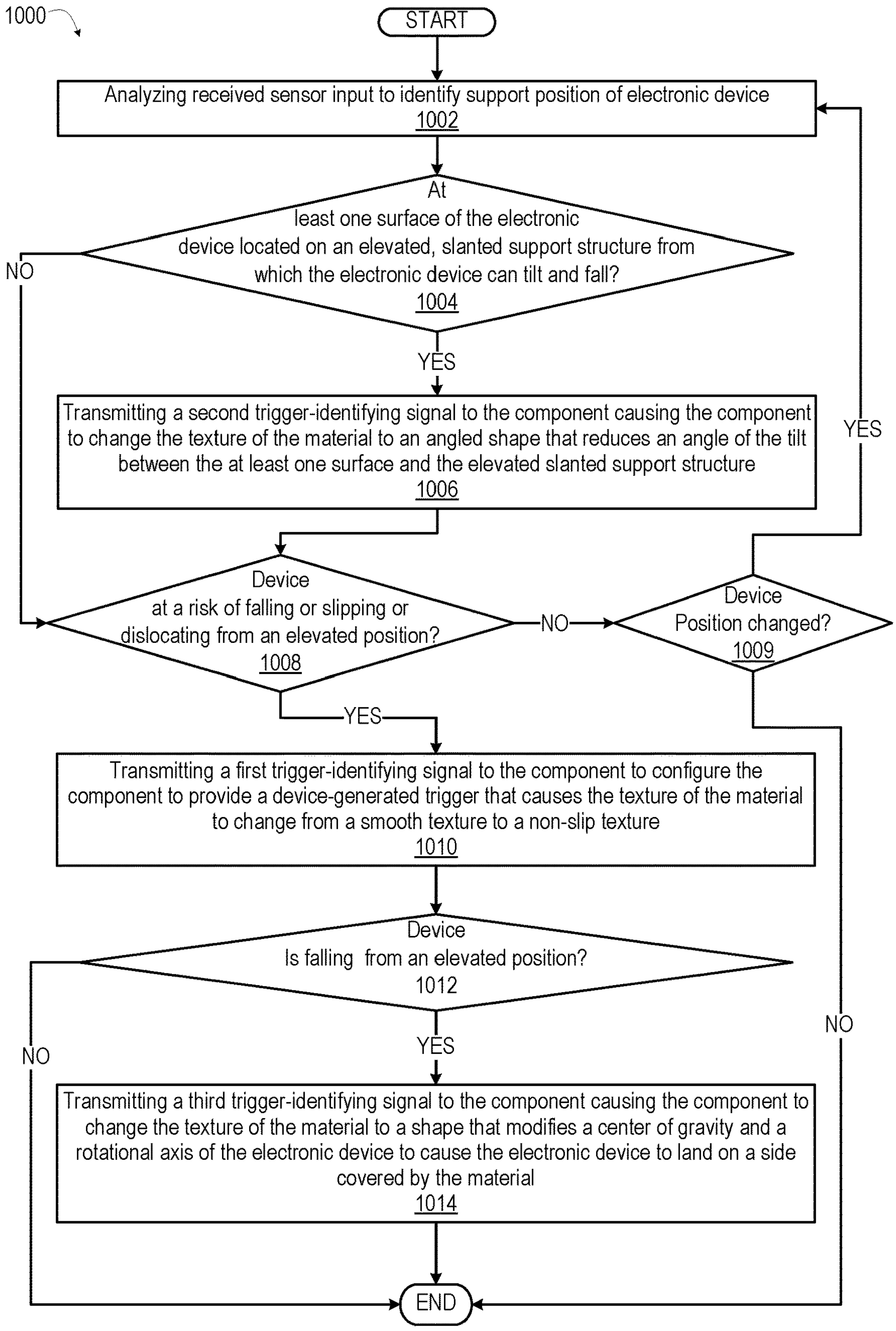
FIG. 10 is a flow diagram presenting additional aspects of a method performed by the portable electronic device for dynamically modifying texture of the material of an exterior rear panel to prevent and/or protect the electronic device from slipping or falling, according to one or more embodiments.

With reference now to the flowcharts, FIG. 9 is a flow diagram presenting a method performed by a portable electronic device for dynamically modifying the texture of a material of an exterior rear panel to prevent and/or protect the electronic device from slipping or falling, according to one or more embodiments. FIG. 10 is a flow diagram presenting additional aspects of a method performed by the portable electronic device for dynamically modifying the texture of the material of an exterior rear panel to prevent and/or protect the electronic device from slipping or falling, according to one or more embodiments. The descriptions of methods 900 and 1000 are provided with general reference to the specific components illustrated within the preceding FIG. 1-FIG. 8C. Specific components referenced in methods 900 and method 1000 may be identical or similar to components of the same name used in describing preceding FIGS. 1-8C. In one or more embodiments, controller 110 (FIG. 1) configures electronic device 100 (FIG. 1) or a similar computing device to provide the described functionality of methods 900 and 1000.

With reference to FIG. 9, following the start block, method 900 includes determining, by a controller of an electronic device, a current support condition of the electronic device (block 902). The electrode device has at least one external surface comprised of a material whose texture can be dynamically changed based on exposure to a device-generated trigger from a device component. According to one or more embodiments, the determining of the current support condition includes receiving, from at least one sensor of the electronic device, sensor input corresponding to the support condition (block 904) and evaluating the received sensor input to determine whether the current support condition is one that would trigger the controller to cause a change in the texture of the external surface material in order to enhance protection of the device from falling or being damaged by a fall (block 906). Method 900 includes determining, at decision block 908, whether the current support condition is one which triggers the controller to cause a change in the texture of the external surface material to enhance protection of the device. Method 900 includes, in response to determining that the current support condition is one that triggers the change in the texture of the external surface material to enhance protection of the device, providing the device-generated trigger to the material to cause a change in the texture of the material of the at least one external surface (block 910). In response to the current support condition not being one that triggers a change in the texture of the external surface material, method 900 ends. The processes provided by method 900 can be automatically repeated whenever the device support condition changes.

Referring now to FIG. 10, following the start block, method 1000 includes analyzing received sensor input to identify a support position of the electronic device (block 1002). Method includes identifying, by the controller, from the received sensor input whether the at least one surface of the electronic device is located on an elevated, slanted support structure from which the electronic device can tilt and fall (block 1004). In response to the received sensor input indicating the at least one surface of the electronic device is located on the elevated slanted support structure from which the electronic device can tilt and fall, method includes transmitting a second trigger-identifying signal to the component causing the component to change the texture of the material to an angled shape that reduces an angle of the tilt between the at least one surface and the elevated slanted support structure (block 1006). From block 1006 or when decision block 1004 resolves to a negative ("no") output, method 1000 includes determining whether the support condition corresponds to the electronic device being at a risk of falling or slipping or dislocating from an elevated position (block 1008). In situations where the current support condition does not indicate that the device is at risk of falling, method 1000 can include determining, at block 1009, whether the device position is changed. In response to detecting a change in the device position, method 1000 returns to block 1002 to received sensor input to evaluate the support condition associated with the new device position. Otherwise, from block 1009, method 1000 proceeds to the end block. Returning to block 1008, in response to the current support condition indicating that the electronic device is at a risk of falling or slipping or dislocating from an elevated position, method 1000 includes transmitting a first trigger-identifying signal to the component to configure the component to provide a device-generated trigger that causes the texture of the material to change from a smooth texture to a non-slip texture (block 1010).

Following, method 1000 includes determining from the sensor input whether the device is falling from an elevated position (block 1012). In response to the sensor input indicating the electronic device is falling, method includes transmitting a third trigger-identifying signal to the component causing the component to change the texture of the material to a shape that modifies a center of gravity and a rotational axis of the electronic device (block 1014). The modification causes the electronic device to land on a side covered by the material, which protects the electronic device during a fall of the electronic device from an elevated position. Method 1000 then ends.

According to one or more embodiments, the material of the at least one external surface is changeable into multiple different textures each triggered by one of multiple device-generated triggers that is provided by the component, a selected trigger among the multiple device-generated triggers being identified by the controller based on characteristics of the current support condition. Method 1000 includes transmitting a corresponding trigger-identifying signal to the component to provide the selected trigger and cause the change of the texture of the material to a specific one of the multiple different textures.

According to one or more embodiments, the device-generated trigger comprises application of at least one of a voltage, a pressure, a current, a temperature, or a humidity to the material. Also, an amount of relative change in the texture of the material is determined by the corresponding level of the voltage, pressure, current, temperature, or humidity applied to the material. Method 1000 includes determining the corresponding level of the voltage, pressure, current, temperature, or humidity to be applied to the material, based on the current support condition of the electronic device and the amount of relative change required for the current support condition. Method 1000 includes applying the corresponding level of the voltage, pressure, current, temperature, or humidity to the material.

Aspects of the present innovation are described above with reference to flowchart illustrations and/or block diagrams of methods, apparatus (systems) and computer program products according to embodiments of the innovation. It will be understood that each block of the flowchart illustrations and/or block diagrams, and combinations of blocks in the flowchart illustrations and/or block diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

As will be appreciated by one skilled in the art, embodiments of the present innovation may be embodied as a system, device, and/or method. Accordingly, embodiments of the present innovation may take the form of an entirely hardware embodiment or an embodiment combining software and hardware embodiments that may all generally be referred to herein as a "circuit," "module" or "system."

While the innovation has been described with reference to exemplary embodiments, it will be understood by those skilled in the art that various changes may be made, and equivalents may be substituted for elements thereof without departing from the scope of the innovation. In addition, many modifications may be made to adapt a particular system, device, or component thereof to the teachings of the innovation without departing from the essential scope thereof. Therefore, it is intended that the innovation not be limited to the particular embodiments disclosed for carrying out this innovation, but that the innovation will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the innovation. As used herein, the singular forms "a", "an" and "the" are intended to include the plural forms as well, unless the context clearly indicates otherwise. It will be further understood that the terms "comprise" and/or "comprising." when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present innovation has been presented for purposes of illustration and description but is not intended to be exhaustive or limited to the innovation in the form disclosed. Many modifications and variations will be apparent to those of ordinary skill in the art without departing from the scope and spirit of the innovation. The embodiments were chosen and described in order to best explain the principles of the innovation and the practical application, and to enable others of ordinary skill in the art to understand the innovation for various embodiments with various modifications as are suited to the particular use contemplated.

What is claimed is:

1. An electronic device comprising:

at least one external surface comprised of a material whose texture can be dynamically changed based on exposure to a device-generated trigger;

at least one sensor that detects a support condition of the electronic device; and a controller communicatively coupled to the at least one sensor and to a component that provides the device-generated trigger, and which:

receives, from the at least one sensor, sensor input corresponding to the support condition;

evaluates the received sensor input to determine whether a current support condition is one that comprises the electronic device being at a risk of falling while the electronic device is located on a support structure, which triggers the controller to cause a change in the texture of the external surface material to enhance protection of the device by reducing the risk of falling; and in response to determining that the current support condition is one that triggers the change in the texture of the external surface material, transmits a signal to the component, which signal activates the component to provide the device-generated trigger, causing the change in the texture of the external surface material.

2. The electronic device of claim 1, wherein:

the support condition corresponds to whether the electronic device is at a risk of falling or slipping or dislocating from an elevated position; and in response to the current support condition indicating that the electronic device is at a risk of falling or slipping or dislocating from an elevated position, the controller transmits a first trigger-identifying signal to the component to configure the component to provide the device-generated trigger that causes the texture of the material to change from a smooth texture to a non-slip texture.

3. The electronic device of claim 1, wherein the controller:

identifies from the received sensor input that the at least one surface of the electronic device is located on an elevated slanted support structure from which the electronic device can tilt and fall; and in response to the received sensor input indicating the at least one surface of the electronic device is located on the elevated slanted support structure from which the electronic device can tilt and fall, transmit a second trigger-identifying signal to the component causing the component to change the texture of the material to an angled shape that reduces an angle of the tilt between the at least one surface and the elevated slanted support structure.

4. The electronic device of claim 1, wherein the controller:

in response to the sensor input indicating the electronic device is falling:

transmit a third trigger-identifying signal to the component causing the component to change the texture of the material to a shape that modifies a center of gravity and a rotational axis of the electronic device to cause the electronic device to land on a side covered by the material, which protects the electronic device during a fall of the electronic device from an elevated position.

5. The electronic device of claim 1, wherein the material of the at least one external surface is changeable into multiple different textures each triggered by one of multiple device-generated triggers that is provided by the component, a selected trigger among the multiple device-generated triggers being identified by the controller based on characteristics of the current support condition, the controller transmitting a corresponding trigger-identifying signal to the component to provide the selected trigger and cause the change of the texture of the material to a specific one of the multiple different textures.

6. The electronic device of claim 1, wherein the device-generated trigger comprises application of at least one of a voltage, a pressure, a current, a temperature, or a humidity to the material.

7. The electronic device of claim 6, wherein:

an amount of relative change in the texture of the material is determined by a corresponding level of the voltage, pressure, current, temperature, or humidity applied to the material; and the controller: determines the corresponding level of the voltage, pressure, current, temperature, or humidity to be applied to the material, based on the current support condition of the electronic device and the amount of relative change required for the current support condition; and encodes the corresponding level in the signal transmitted to the component.

8. The electronic device of claim 6, wherein:

the component comprises multiple sub-components that each correspond to a different one of the device-generated trigger;

each different device-generated trigger produces a different change in the texture of the material; and the controller: selects which one of the multiple sub-components is utilized, based on the current support condition of the device and an amount and type of change desired for the texture of the material; and encodes the selection in the signal transmitted to the component.

9. The electronic device of claim 1, wherein the at least one sensor comprises one or more sensor from among an accelerometer, a gyroscope, a gyrometer, an altimeter, a barometer, an on-body detection sensor.

10. The electronic device of claim 1, further comprising:

a housing that comprises the at least one external surface as a back side of the housing; and a display embedded within a front surface of the housing and communicatively coupled to the controller;

wherein the controller comprises a processor communicatively coupled to a memory, the memory storing program code that is processed by the processor for: evaluating the support condition of the electronic device based on sensor information received from the at least one sensor; and generating a corresponding signal for triggering the change in the texture of the material of the at least one external surface.

11. The electronic device of claim 1, further comprising:

a device housing that encompasses the controller and other functional components and to which the at least one external surface is removably attached; and a connection interface that electrically couples the component with the controller, the component being a part of the at least one external surface.

12. The electronic device of claim 1, wherein the controller:

receives an updated support condition indicating that the electronic device is stable; and generates and transmits a second signal to the component to cause the component to change the texture of the material back to a base texture, wherein the component provides a fourth device-generated trigger causing a reverse change in the texture of the material to the base texture.

13. A method comprising:

determining, by a controller of an electronic device, a current support condition of the electronic device, the electronic device having at least one external surface comprised of a material whose texture can be dynamically changed based on exposure to a device-generated trigger from a device component; and in response to determining that the current support condition is one that comprises the electronic device being at a risk of falling while the electronic device is located on a support structure, which triggers the controller to cause a change in the texture of the external surface material, providing the device-generated trigger to the material to cause a change in the texture of the external surface material to enhance protection of the device by reducing the risk of falling.

14. The method of claim 13, wherein determining the current support condition comprises:

receiving, from at least one sensor of the electronic device, sensor input corresponding to the support condition; and evaluating the received sensor input to determine whether the current support condition is one that triggers the controller to cause the change in the texture of the external surface material.

15. The method of claim 14, further comprising:

identifying, by the controller, from the received sensor input that the at least one surface of the electronic device is located on an elevated, slanted support structure from which the electronic device can tilt and fall; and in response to the received sensor input indicating the at least one surface of the electronic device is located on the elevated slanted support structure from which the electronic device can tilt and fall, transmitting a second trigger-identifying signal to the component causing the component to change the texture of the material to an angled shape that reduces an angle of the tilt between the at least one surface and the elevated slanted support structure.

16. The method of claim 14, further comprising:

in response to the sensor input indicating the electronic device is falling:

transmitting a third trigger-identifying signal to the component causing the component to change the texture of the material to a shape that modifies a center of gravity and a rotational axis of the electronic device to cause the electronic device to land on a side covered by the material, which protects the electronic device during a fall of the electronic device from an elevated position.

17. The method of claim 13, wherein:

the support condition corresponds to whether the electronic device is at a risk of falling or slipping or dislocating from an elevated position; and in response to the current support condition indicating that the electronic device is at a risk of falling or slipping or dislocating from an elevated position, the method comprises transmitting a first trigger-identifying signal to the component to configure the component to provide a device-generated trigger that causes the texture of the material to change from a smooth texture to a non-slip texture.

18. The method of claim 13, wherein the material of the at least one external surface is changeable into multiple different textures each triggered by one of multiple device-generated triggers that is provided by the component, a selected trigger among the multiple device-generated triggers being identified by the controller based on characteristics of the current support condition, the controller transmitting a corresponding trigger-identifying signal to the component to provide the selected trigger and cause the change of the texture of the material to a specific one of the multiple different textures.

19. The method of claim 13, wherein:

the device-generated trigger comprises application of at least one of a voltage, a pressure, a current, a temperature, or a humidity to the material;

an amount of relative change in the texture of the material is determined by a corresponding level of the voltage, pressure, current, temperature, or humidity applied to the material; and the method further comprises:

determining the corresponding level of the voltage, pressure, current, temperature, or humidity to be applied to the material, based on the current support condition of the electronic device and the amount of relative change required for the current support condition; and applying the corresponding level of the voltage, pressure, current, temperature, or humidity to the material.

20. An electronic device cover comprising:

an exterior material having a configurable texture that can be changed based on a received device-provided trigger generated in response to a detected support condition of an electronic device on which the electronic device cover is placed, the detected support condition comprising the electronic device being at a risk of falling while the electronic device is located on a support structure, the received device-provided trigger being a change in at least one of a voltage, a pressure, a current, a temperature, or a humidity applied to the exterior material by the electronic device in response to the detected support condition, a change in the texture of the material being triggered to enhance protection of the device by reducing a risk of falling.

* * * * *